(12) United States Patent
Li et al.

(10) Patent No.: US 10,535,414 B2
(45) Date of Patent: Jan. 14, 2020

(54) SHIFT REGISTER ELEMENT, METHOD FOR DRIVING THE SAME, AND DISPLAY DEVICE

(71) Applicant: Shanghai Tianma AM-OLED Co., Ltd, Shanghai (CN)

(72) Inventors: Yue Li, Shanghai (CN); Renyuan Zhu, Shanghai (CN); Dongxu Xiang, Shanghai (CN); Yana Gao, Shanghai (CN); Zeyuan Chen, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 241 days.

(21) Appl. No.: 15/864,818

(22) Filed: Jan. 8, 2018

(65) Prior Publication Data
US 2018/0130542 A1 May 10, 2018

(30) Foreign Application Priority Data
Jul. 10, 2017 (CN) .......................... 2017 1 0557059

(51) Int. Cl.
| | | |
|---|---|---|
| *G11C 19/00* | (2006.01) | |
| *G11C 19/28* | (2006.01) | |
| *G09G 3/20* | (2006.01) | |
| *G09G 5/00* | (2006.01) | |
| *G09G 3/36* | (2006.01) | |

(52) U.S. Cl.
CPC .............. *G11C 19/28* (2013.01); *G09G 3/20* (2013.01); *G09G 5/003* (2013.01); *G09G 3/3677* (2013.01); *G09G 2310/0286* (2013.01); *G09G 2330/021* (2013.01)

(58) Field of Classification Search
None
See application file for complete search history.

(56) References Cited

U.S. PATENT DOCUMENTS

| | | | |
|---|---|---|---|
| 2008/0101529 A1* | 5/2008 | Tobita | G09G 3/3677 377/64 |
| 2008/0218401 A1* | 9/2008 | Loomis | G01S 19/09 342/66 |
| 2010/0188381 A1 | 7/2010 | Jang | |
| 2013/0170606 A1* | 7/2013 | Matsui | G11C 19/28 377/64 |
| 2014/0177780 A1* | 6/2014 | Qi | G09G 3/20 377/64 |

(Continued)

*Primary Examiner* — Tuan T Lam
(74) *Attorney, Agent, or Firm* — Alston & Bird LLP

(57) ABSTRACT

A shift register element, a method for driving the same, and a display device are disclosed. The shift register element includes: an output module configured to provide an output terminal with a signal of a first signal terminal or a second signal terminal by voltage applied to a first node and a second node; a first driver configured to control voltage of the first node by the signal of the first input terminal; a second driver configured to control voltage of the second node by the signal of the first input terminal, and a signal of a third input terminal; a first feedback and adjustment module configured to control the voltage of the first node by the signals of the output terminal and the second input terminal; and a second feedback and adjustment module configured to control the voltage of the second node by the signal of the output terminal.

17 Claims, 18 Drawing Sheets

(56) References Cited

U.S. PATENT DOCUMENTS

| | | | |
|---|---|---|---|
| 2016/0187554 A1* | 6/2016 | Lee | G02B 5/3083 |
| | | | 349/193 |
| 2017/0018243 A1* | 1/2017 | Huang | G09G 3/36 |
| 2017/0039971 A1* | 2/2017 | Huang | G09G 3/3677 |
| 2017/0287388 A1* | 10/2017 | Ma | G09G 3/20 |
| 2018/0240394 A1* | 8/2018 | Feng | G11C 19/184 |

* cited by examiner

SHIFT REGISTER ELEMENT, METHOD FOR DRIVING THE SAME, AND DISPLAY DEVICE

CROSS REFERENCE TO RELATED APPLICATION

This application claims priority to Chinese Patent Application No. CN 201710557059.4, filed with the Chinese Patent Office on Jul. 10, 2017. The entire disclosure of the above application is incorporated herein by reference.

FIELD

The present invention relates to the field of display technologies, and particularly to a shift register element, a method for driving the same, and a display device.

BACKGROUND

As display screens are developing constantly, consumers require higher and higher stability of display screens. The stability of display screens highly depends on their gate driving circuits, and shift register elements constituting the gate driving circuits.

At present, a shift register element in which a control signal is a scan signal is illustrated in FIG. 1A, which shows a schematic structural diagram of a shift register element in the prior art including six transistors (M1 to M6) and two capacitors (C1 and C2), where all of the first transistor M1 to the sixth transistor M6 are P-type thin film transistors. FIG. 1B illustrates a timing diagram corresponding to the circuit of the shift register element illustrated in FIG. 1A, where in a T stage, the fourth transistor M4 is switched on by a first scan signal S1 to provide a first node N1 with a low-level signal, and the fifth transistor M5 is switched on to provide a second node N2 with a high-level signal; in a T2 stage, potentials of both the first node N1 and the second node N2 are maintained by capacitors; in a T3 stage, the sixth transistor and the third transistor are switched on by the second scan signal S2 to provide the second node N2 with a low-level signal, and the first node N1 with a high-level signal; and in a T4 stage, the first node N1 and the second node N2 are not provided with any signal but are floating until the end of a frame, where their potentials are maintained by the capacitors, so there is poor stability of the circuit because the first node N1 and the second node N2 are susceptible to interference of an external signal, e.g., an electrostatic signal, a scan signal or an output signal of another level of circuit, etc., thus easily resulting in an output error of the circuit.

SUMMARY

Embodiments of the invention provide a shift register element, a method for driving the same, a display panel, and a display device so as to address the problem of instability of the circuit in the prior art.

An embodiment of the invention provides a shift register element that includes: an output module, a first driver, a second driver, a first feedback and adjustment module and a second feedback and adjustment module. The output module has a first node and a second node, and is configured to provide an output terminal with a signal of a first signal terminal or a second signal terminal according to voltage applied to the first node and the second node. The first driver is configured to control the voltage of the first node according to a signal of a first input terminal. The second driver is configured to control the voltage of the second node according to the signal of the first input terminal, and a signal of a third input terminal. The first feedback and adjustment module is configured to control the voltage of the first node according to the signals of the output terminal and the second input terminal. And the second feedback and adjustment module is configured to control the voltage of the second node according to the signal of the output terminal.

Correspondingly, an embodiment of the invention further provides a method for driving the shift register element above. In a first stage, providing the first input terminal with a first level signal, and the third input terminal with a second level signal, to output the signal of the first signal terminal at the output terminal. In a second stage, providing the first input terminal and the third input terminal with the second level signal, to output the signal of the first signal terminal at the output terminal. In a third stage, providing the third input terminal with the first level signal, and the first input terminal and the second input terminal with the second level signal, to output the signal of the second signal terminal at the output terminal. And in a fourth stage, providing the first input terminal, the second input terminal, and the third input terminal with the second level signal, to output the signal of the second signal terminal at the output terminal.

Correspondingly, an embodiment of the invention further provides a display device including a display panel, and the display panel includes N shift register elements in cascade connection, where N is an integer, and the N shift register elements each is the above shift register element according to the embodiment of the invention.

DETAILED DESCRIPTION OF THE EMBODIMENTS

Figure 1A:
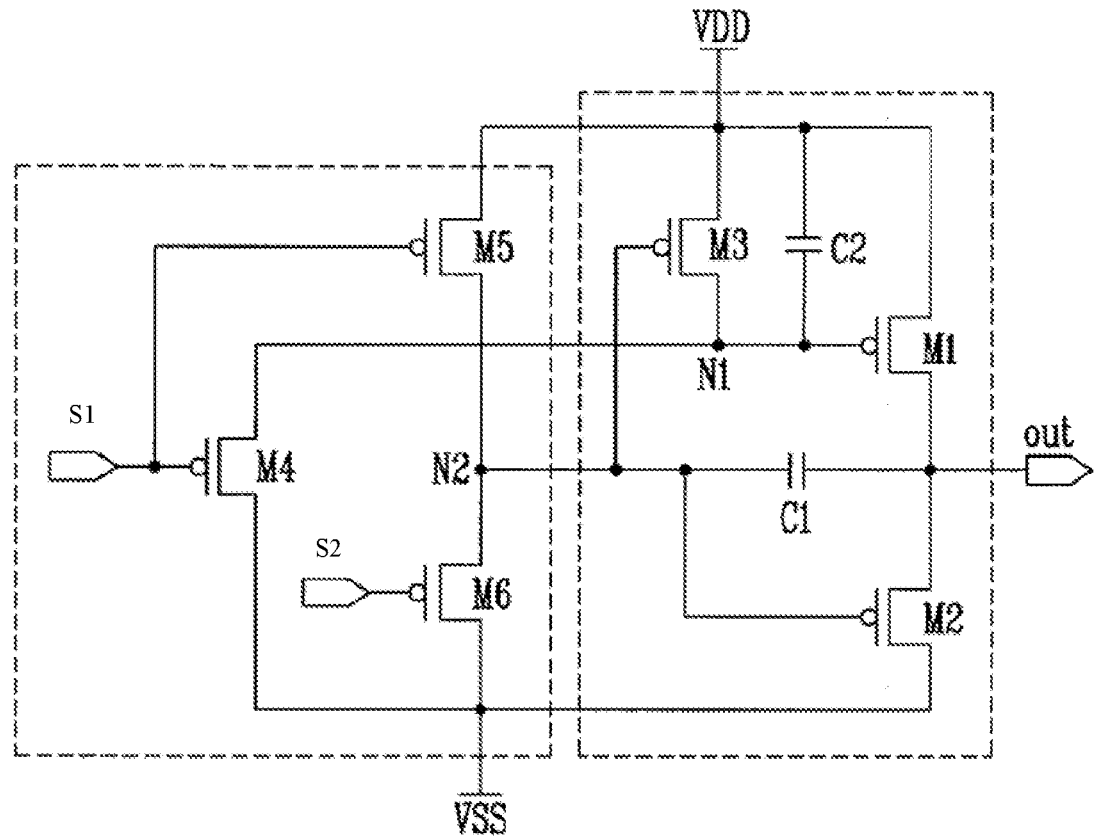
FIG. 1A is a schematic structural diagram of a shift register element in the prior art.
Figure 1B:
FIG. 1B is a timing diagram corresponding to the circuit of the shift register element illustrated in FIG. 1A.

In order to make the objects, technical solutions, and advantages of the embodiments of the invention more apparent, the invention will be described below in further details with reference to the drawings, and apparently the embodiments described below are only a part but not all of the embodiments of the invention. Based upon the embodiments of the invention shown here, all the other embodiments which can occur to those skilled in the art without any inventive effort shall fall into the scope of the invention.

The shapes and sizes of respective components in the drawings are not intended to reflect a real proportion, but are only intended to illustrate the disclosure of the invention.

Figure 2:
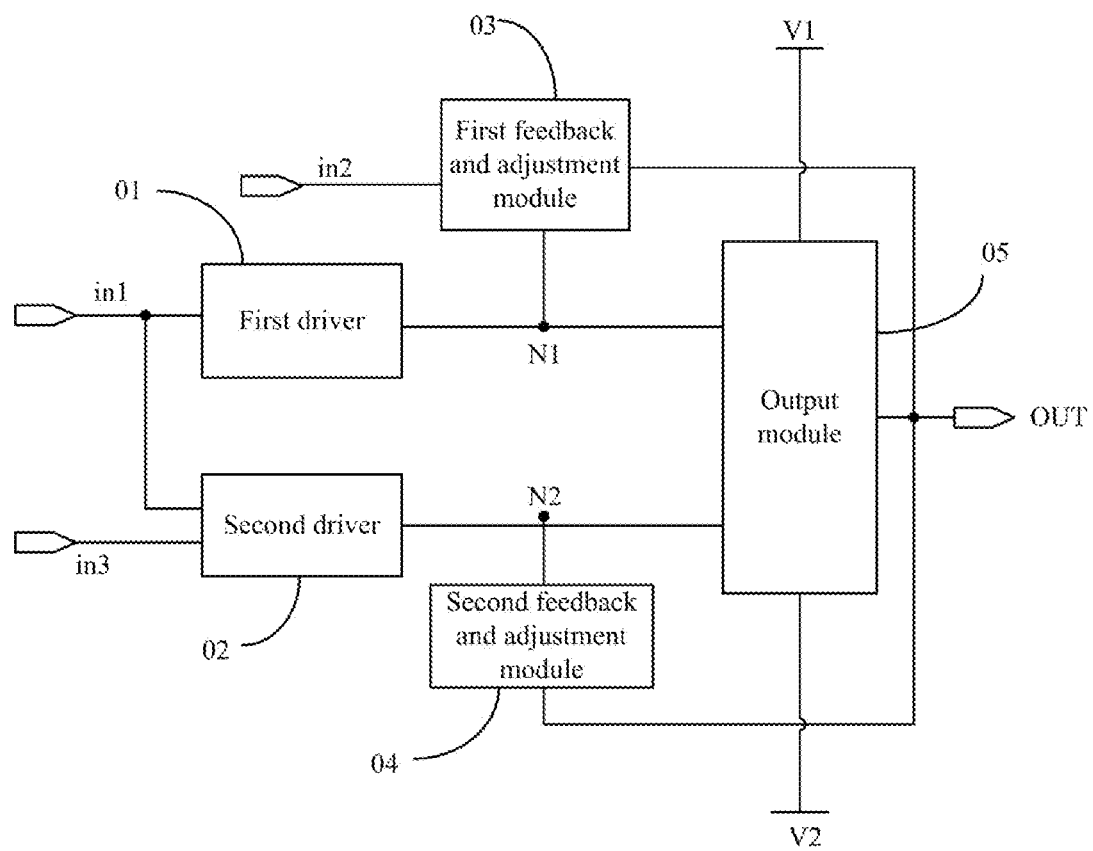
FIG. 2 is a schematic structural diagram of a shift register element according to an embodiment of the invention.

An embodiment of the invention provides a shift register element as illustrated in FIG. 2 which is a schematic structural diagram of a shift register element according to an embodiment of the invention, where the shift register element includes:

An output module 05 including a first node N1 and a second node N2, configured to provide an output terminal OUT with a signal of a first signal terminal V1 or a second signal terminal V2 according to voltage applied to the first node N1 and the second node N2;

A first driver 01 configured to control the voltage of the first node N1 according to a signal of a first input terminal in1;

A second driver 02 configured to control the voltage of the second node N2 according to the signal of the first input terminal in1, and a signal of a third input terminal in3;

A first feedback and adjustment module 03 configured to control the voltage of the first node N1 according to the signals of the output terminal OUT and the second input terminal in2; and A second feedback and adjustment module 04 configured to control the voltage of the second node N2 according to the signal of the output terminal OUT.

The shift register element according to the embodiment of the invention include: the output module configured to provide the output terminal with the signal of the first signal terminal or the second signal terminal according to the voltage applied to the first node and the second node; the first driver configured to control the voltage of the first node according to the signal of the first input terminal; the second driver configured to control the voltage of the second node according to the signals of the first input terminal and the third input terminal; the first feedback and adjustment module configured to control the voltage of the first node according to the signals of the output terminal and the second input terminal; and the second feedback and adjustment module configured to control the voltage of the second node according to the signal of the output terminal. Since the first feedback and adjustment module controls the first node using the signal of the output terminal, and the second feedback and adjustment module controls the second node using the signal of the output terminal, the first node and the second node can be set and reset in real time to thereby avoid the output of the circuit from any external interference so as to improve the reliability of the circuit.

It shall be noted that the "node" in the embodiment of the invention refers to a connection point between the respective modules in the shift register element, for example, the first node N1 in FIG. 2 refers to a connection point of the second driver, the second feedback and adjustment module, and the output module.

Figure 3:
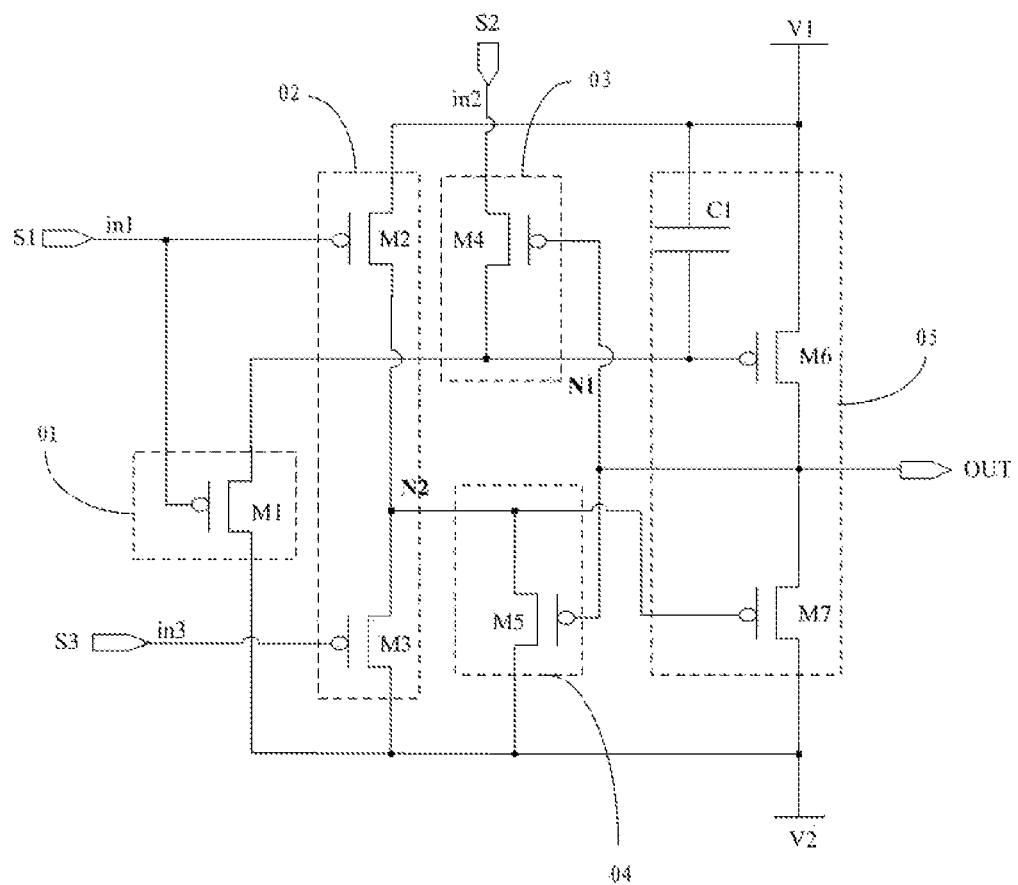
FIG. 3 is a schematic structural diagram of a shift register element according to another embodiment of the invention.
Figure 4:
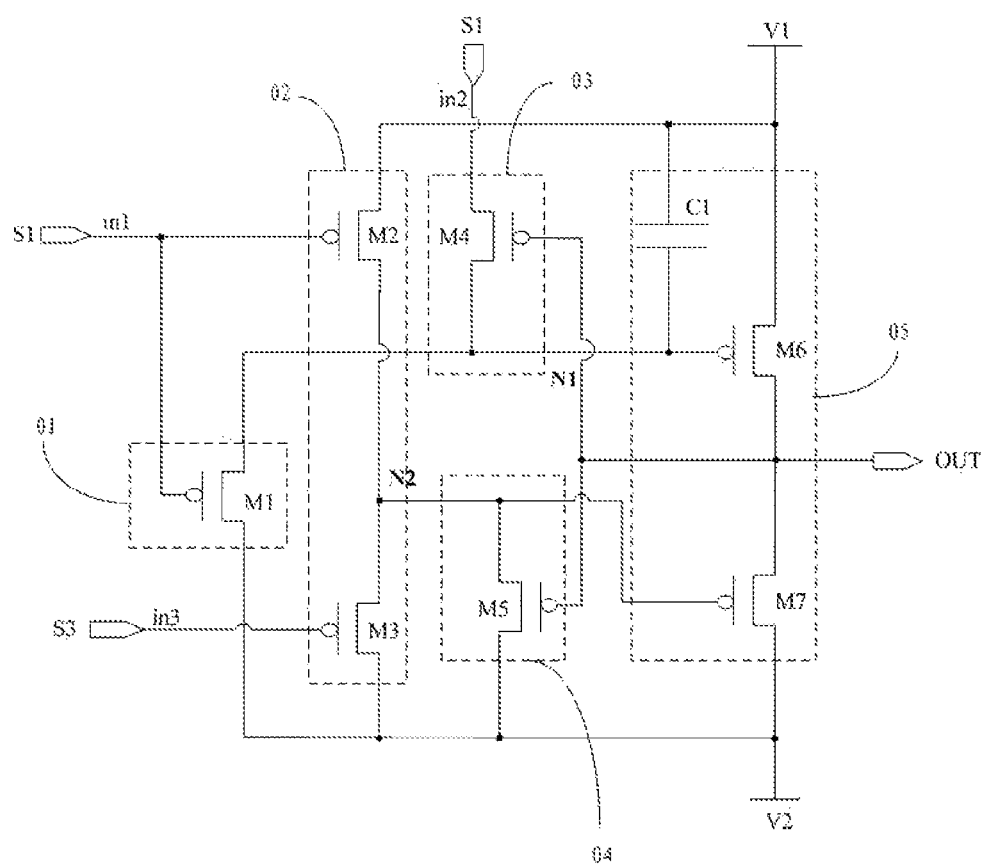
FIG. 4 is a schematic structural diagram of a shift register element according to another embodiment of the invention.
Figure 5:
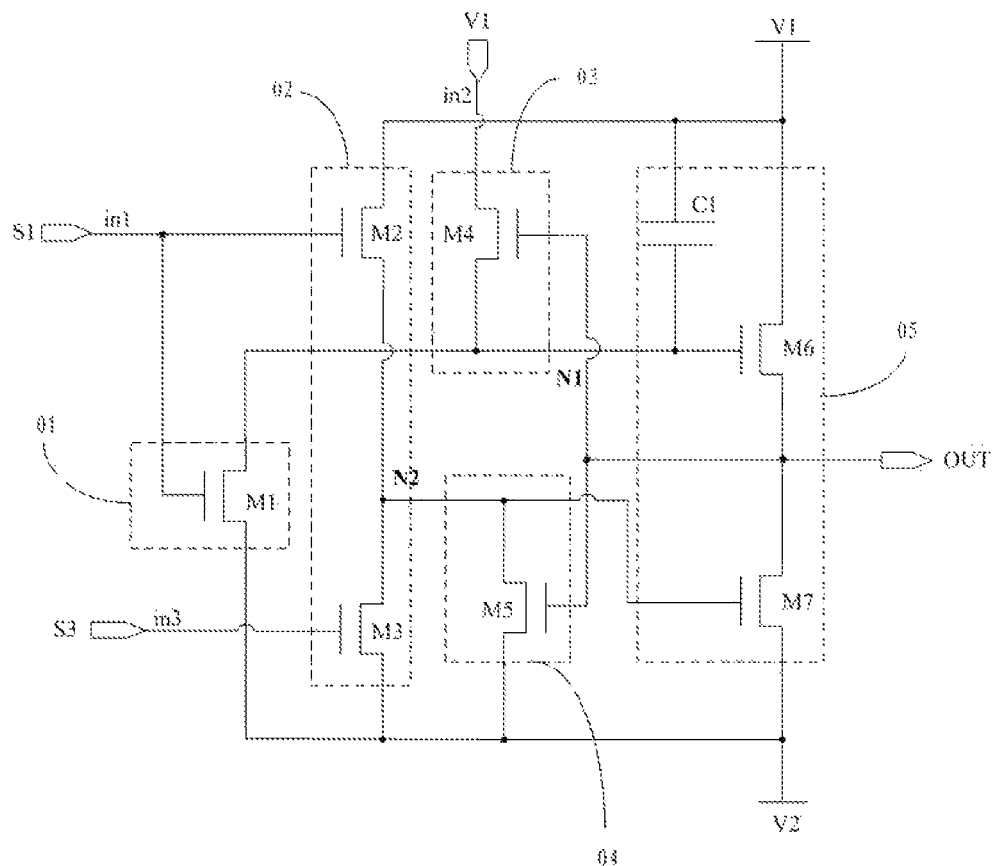
FIG. 5 is a schematic structural diagram of a shift register element according to another embodiment of the invention.

Particularly in the shift register element according to the embodiment of the invention, as illustrated in FIG. 3 to FIG. 5, where FIG. 3 shows a schematic structural diagram of a shift register element according to another embodiment of the invention; FIG. 4 shows a schematic structural diagram of a shift register element according to further another embodiment of the invention; and FIG. 5 shows a schematic structural diagram of a shift register element according to further another embodiment of the invention.

The first input terminal in1 is configured to receive a first scan signal S1.

The third input terminal in3 is configured to receive a third scan signal S3.

As illustrated in FIG. 3, the second input terminal in2 is configured to receive a second scan signal S2; or as illustrated in FIG. 4, the second input terminal in2 is configured to receive the first scan signal S1; or as illustrated in FIG. 5, the second input terminal in2 is configured to receive the signal of the first signal terminal V1.

Figure 6A:
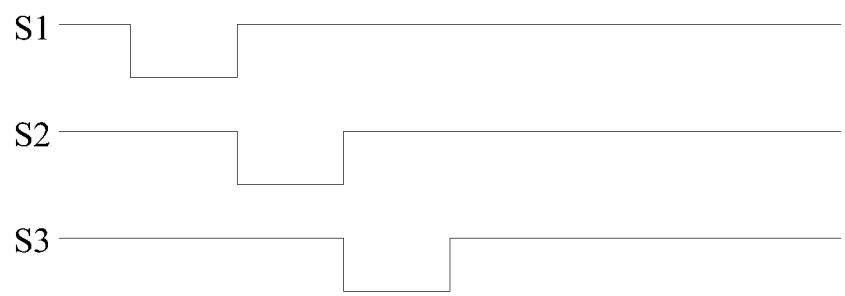
FIG. 6A is a timing diagram of an input signal corresponding to the shift register element according to an embodiment of the invention.
Figure 6B:
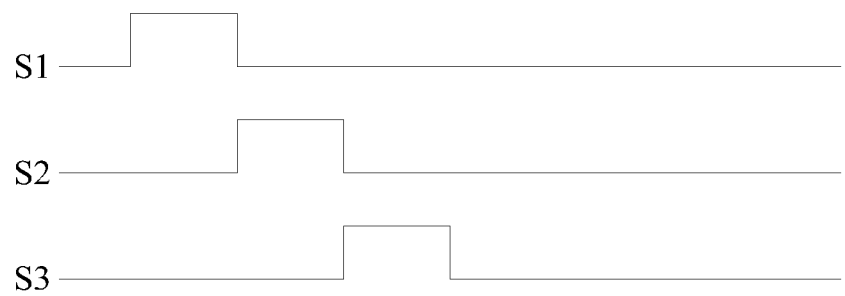
FIG. 6B is a timing diagram of an input signal corresponding to the shift register element according to another embodiment of the invention.

For the shift register element according to the embodiment of the invention, a timing diagram of an input signal corresponding to the shift register element according to the embodiment of the invention is shown in FIG. 6A; and another timing diagram of an input signal corresponding to the shift register element according to the embodiment of the invention is shown in FIG. 6B.

Active pulse signals of the first scan signal S1, the second scan signal S2, and the third scan signal S3 are maintained for the same length of time, the active pulse signal of the second scan signal S2 is output after the output of the active pulse signal of the first scan signal S1 ends, and the active pulse signal of the third scan signal S3 is output after the output of the active pulse signal of the second scan signal S2 ends.

In one or more embodiment, in the shift register element according to the embodiment of the invention, the signal of the first signal terminal V1 is a high-level signal, and the signal of the second signal terminal V2 is a low-level signal.

As illustrated in FIG. 6A, all the active pulse signals of the first scan signal S1, the second scan signal S2, and the third scan signal S3 are low-level signals.

Optionally, in the shift register element according to the embodiment of the invention, the signal of the first signal terminal V1 is a low-level signal, and the signal of the second signal terminal V2 is a high-level signal.

As illustrated in FIG. 6B, all the active pulse signals of the first scan signal S1, the second scan signal S2, and the third scan signal S3 are high-level signals.

The invention will be described below in details with reference to particular embodiments thereof. It shall be noted that these embodiments are intended to better set forth the invention, but not to limit the invention.

Optionally, in the shift register element according to the embodiment of the invention, as illustrated in FIG. 3 to FIG. 5, the first driver 01 includes a first transistor 01.

The first transistor M1 has a gate connected with the first input terminal in1, a first electrode connected with the second signal terminal V2, and a second electrode connected with the first node N1.

As illustrated in FIG. 3 and FIG. 4, the first transistor M1 may be a P-type transistor, or as illustrated in FIG. 5, the first transistor M1 may be an N-type transistor, although the embodiment of the invention will not be limited thereto.

In one or more embodiment, in the shift register element according to the embodiment of the invention, if the first transistor is controlled by the first input terminal to be switched on, then the signal of the second signal terminal will be provided to the first node with control to the voltage of the first node.

The particular structure of the first driver in the shift register element according to the embodiment of the invention has been described above merely by way of an example, but in a particular implementation, the particular structure of the first driver will not be limited to the structure above according to the embodiment of the invention, but may alternatively be another structure known to those skilled in the art, so the embodiment of the invention will not be limited thereto.

Optionally, in the shift register element according to the embodiment of the invention, as illustrated in FIG. 3 to FIG. 5, the second driver 02 includes a second transistor M2 and a third transistor M3.

The second transistor M2 has a gate connected with the first input terminal in1, a first electrode connected with the first signal terminal V1, and a second electrode connected with the second node N2.

The third transistor M3 has a gate connected with the third input terminal in3, a first electrode connected with the second signal terminal V2, and a second electrode connected with the second node N2.

As illustrated in FIG. 3 and FIG. 4, the second transistor M2 and the third transistor M3 may be P-type transistors, or as illustrated in FIG. 5, the second transistor M2 and the third transistor M3 may be N-type transistors, although the embodiment of the invention will not be limited thereto.

In one or embodiment, if the second transistor is controlled by the first input terminal to be switched on, then the signal of the first signal terminal will be provided to the second node to control the voltage of the second node. If the third transistor is controlled by the third input terminal to be switched on, then the signal of the second signal terminal will be provided to the second node to control the voltage of the second node.

The particular structure of the second driver in the shift register element according to the embodiment of the invention has been described above merely by way of an example, but in a particular implementation, the particular structure of the second driver will not be limited to the structure above, according to the embodiment of the invention, but may alternatively be another structure known to those skilled in the art, so the embodiment of the invention will not be limited thereto.

Optionally, in the shift register element according to the embodiment of the invention, as illustrated in FIG. 3 to FIG. 5, the first feedback and adjustment module includes a fourth transistor M4.

The fourth transistor M4 has a gate connected with the output terminal OUT, a first electrode connected with the second input terminal in2, and a second electrode connected with the first node N1.

As illustrated in FIG. 3 and FIG. 4, the fourth transistor M4 may be a P-type transistor, or as illustrated in FIG. 5, the fourth transistor M4 may be an N-type transistor, although the embodiment of the invention will not be limited thereto.

In one or more embodiment, if the fourth transistor is controlled by the output terminal to be switched on, then the signal of the first signal terminal will be provided to the first node to control the voltage of the first node to thereby shorten a period of time for which the first node is floating.

The particular structure of the first feedback and adjustment module in the shift register element according to the embodiment of the invention has been described above merely by way of an example, but in a particular implementation, the particular structure of the first feedback and adjustment module will not be limited to the structure above according to the embodiment of the invention, but may alternatively be another structure known to those skilled in the art, so the embodiment of the invention will not be limited thereto.

Optionally, in the shift register element according to the embodiment of the invention, as illustrated in FIG. 3 to FIG. 5, the second feedback and adjustment module includes a fifth transistor M5.

The fifth transistor M5 has a gate connected with the output terminal OUT, a first electrode connected with the second signal terminal V2, and a second electrode connected with the second node N2.

As illustrated in FIG. 3 and FIG. 4, the fifth transistor M5 may be a P-type transistor, or as illustrated in FIG. 5, the fifth transistor M5 may be an N-type transistor, although the embodiment of the invention will not be limited thereto.

In one or more embodiment, if the fifth transistor is controlled by the output terminal to be switched on, then the signal of the second signal terminal will be provided to the second node to control the voltage of the second node to thereby shorten a period of time for which the second node is floating.

The particular structure of the second feedback and adjustment module in the shift register element according to the embodiment of the invention has been described above merely by way of an example, but in a particular implementation, the particular structure of the second feedback and adjustment module will not be limited to the structure above according to the embodiment of the invention, but may alternatively be another structure known to those skilled in the art, so the embodiment of the invention will not be limited thereto.

Optionally in the shift register element according to the embodiment of the invention, as illustrated in FIG. 3 to FIG. 5, the output module includes a sixth transistor M6, a seventh transistor M7, and a first capacitor C1.

The sixth transistor M6 has a gate connected with the first node N1, a first electrode connected with the first signal terminal V1, and a second electrode connected with the output terminal OUT.

The seventh transistor M7 has a gate connected with the second node N2, a first electrode connected with the second signal terminal V2, and a second electrode connected with the output terminal OUT.

The first capacitor C1 has one terminal connected with the first node N1, and the other terminal connected with the first signal terminal V1.

As illustrated in FIG. 3 and FIG. 4, both the sixth transistor M6 and the seventh transistor M7 may be P-type transistors, or as illustrated in FIG. 5, the sixth transistor M6 and the seventh transistor M7 may be N-type transistors, although the embodiment of the invention will not be limited thereto.

In one or more embodiment, if the sixth transistor is controlled by the first node to be switched on, then the signal of the first signal terminal will be provided to the output terminal to control the voltage of the output terminal. If the seventh transistor is controlled by the second node to be switched on, then the signal of the second signal terminal will be provided to the output terminal to control the voltage of the output terminal.

The particular structure of the output module in the shift register element according to the embodiment of the invention has been described above merely by way of an example, but in a particular implementation, the particular structure of the output module will not be limited to the structure above according to the embodiment of the invention, but may alternatively be another structure known to those skilled in the art, so the embodiment of the invention will not be limited thereto.

In one or more embodiment, in order to make a fabrication process uniform, in the shift register element according to the embodiment of the invention, as illustrated in FIG. 3 and FIG. 4, all the transistors are P-type transistors, or as illustrated in FIG. 5, all the transistors are N-type transistors.

In the shift register element according to the embodiment of the invention, an N-type transistor is switched on by a high-level signal, and switched off by a low-level signal; and a P-type transistor is switched on by a low-level signal, and switched off by a high-level signal.

In one or more embodiment, in the shift register element according to the embodiment of the invention, a first electrode of a transistor may be a source, and a second electrode thereof may be a drain; or a first electrode of a transistor may be a drain, and a second electrode thereof may be a source, although the embodiment of the invention will not be limited thereto.

It shall be noted that in the shift register element according to the embodiment of the invention, if all the transistors are P-type transistors, then the signal of the first signal terminal will be a high-level signal, and the signal of the second signal terminal will be a low-level signal; and if all the transistors are N-type transistors, then the signal of the first signal terminal will be a low-level signal, and the signal of the second signal terminal will be a high-level signal.

In one or more embodiment, in the shift register element according to the embodiment of the invention, any transistor may be arranged in a double-gate structure in order to alleviate leakage current, although the embodiment of the invention will not be limited thereto.

An operating process of the shift register element according to the embodiment of the invention will be described below with reference to a timing diagram of the circuit. In the following description, 1 represents a high potential, and 0 represents a low potential. It shall be noted that 1 and 0 represent logic levels, and are only intended to better set forth a particular operating process according to an embodiment of the invention, but not to be limited to any particular voltage values.

First Example

Figure 7:
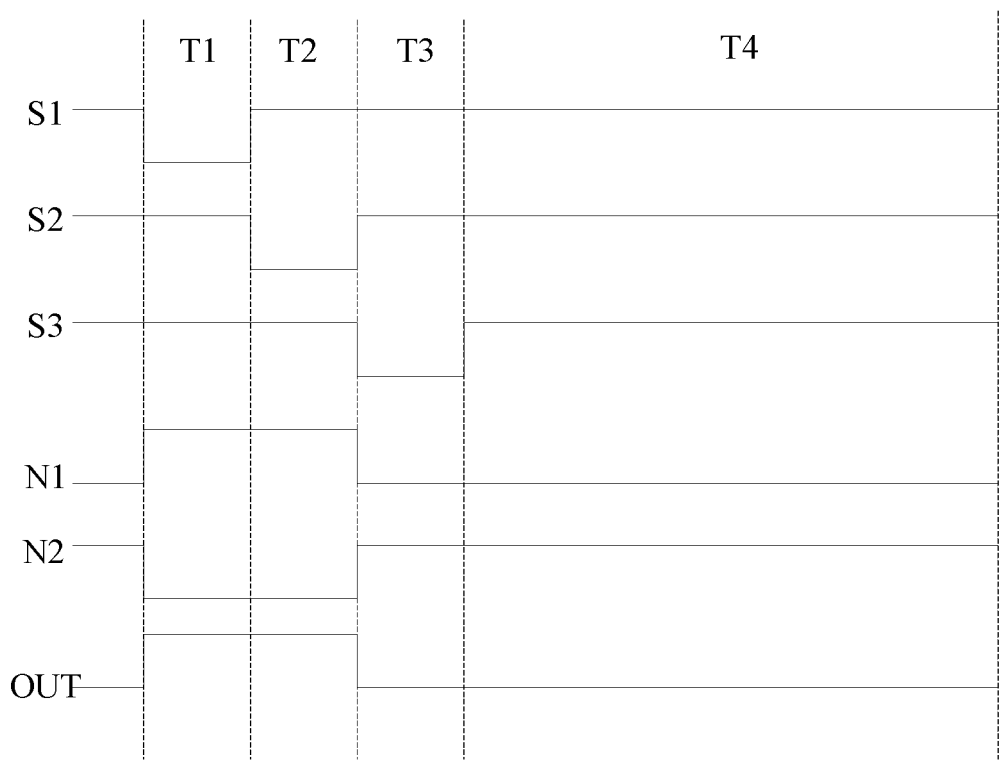
FIG. 7 is an input-output timing diagram corresponding to the shift register element according to an embodiment of the invention.

Taking the shift register element illustrated in FIG. 3 as an example, all the transistors in the shift register element are P-type transistors, and a corresponding input-output timing diagram is as illustrated in FIG. 7; and there are four stages T1, T2, T3, and T4 in the input-output timing diagram as illustrated in FIG. 7.

In the T1 stage, S1=0, S2=1, and S3=1.

Figure 8A:
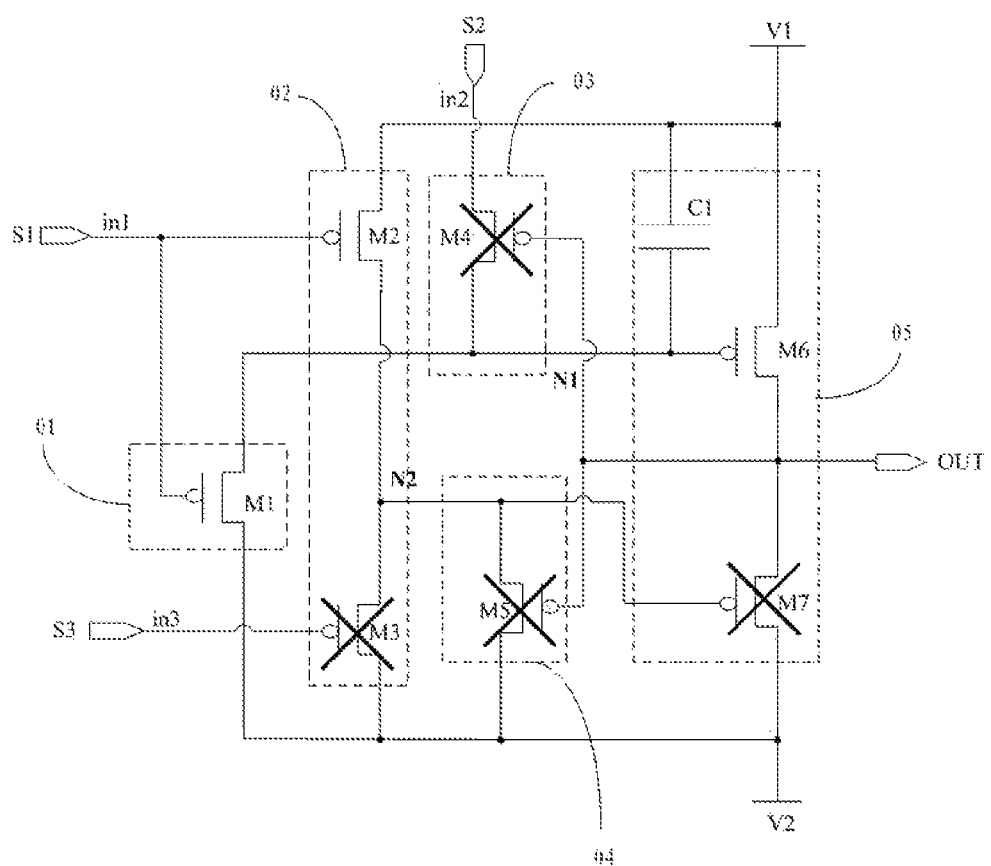
FIG. 8A shows a schematic diagram of operating states of the respective transistors in the shift register element in a T1 stage as illustrated in FIG. 7 according to an embodiment of the invention.

As illustrated in FIG. 8A which shows a schematic diagram of operating states of the respective transistors in the shift register element according to the embodiment of the invention in the T1 stage, with S1=0, the first transistor M1 and the second transistor M2 are switched on. With S3=1, the third transistor M3 is switched off. The high-level signal of the first signal terminal V1 is transmitted to the second node N2 through the second transistor M2, so the potential of the second node N2 is at high-level, and the seventh transistor M7 is switched off. The low-level signal of the second signal terminal V2 is transmitted to the first node n1 through the first transistor M1, so the first node N1 is at a low potential, and the sixth transistor M6 is switched on. The high-level signal of the first signal terminal V1 is transmitted to the output terminal OUT through the sixth transistor M6, so the potential of the output terminal OUT is at high-level. Also the fourth transistor M4 and the fifth transistor M5 are further controlled by the output terminal OUT to be switched off.

In the T2 stage, S1=1, S2=0, and S3=1.

Figure 8B:
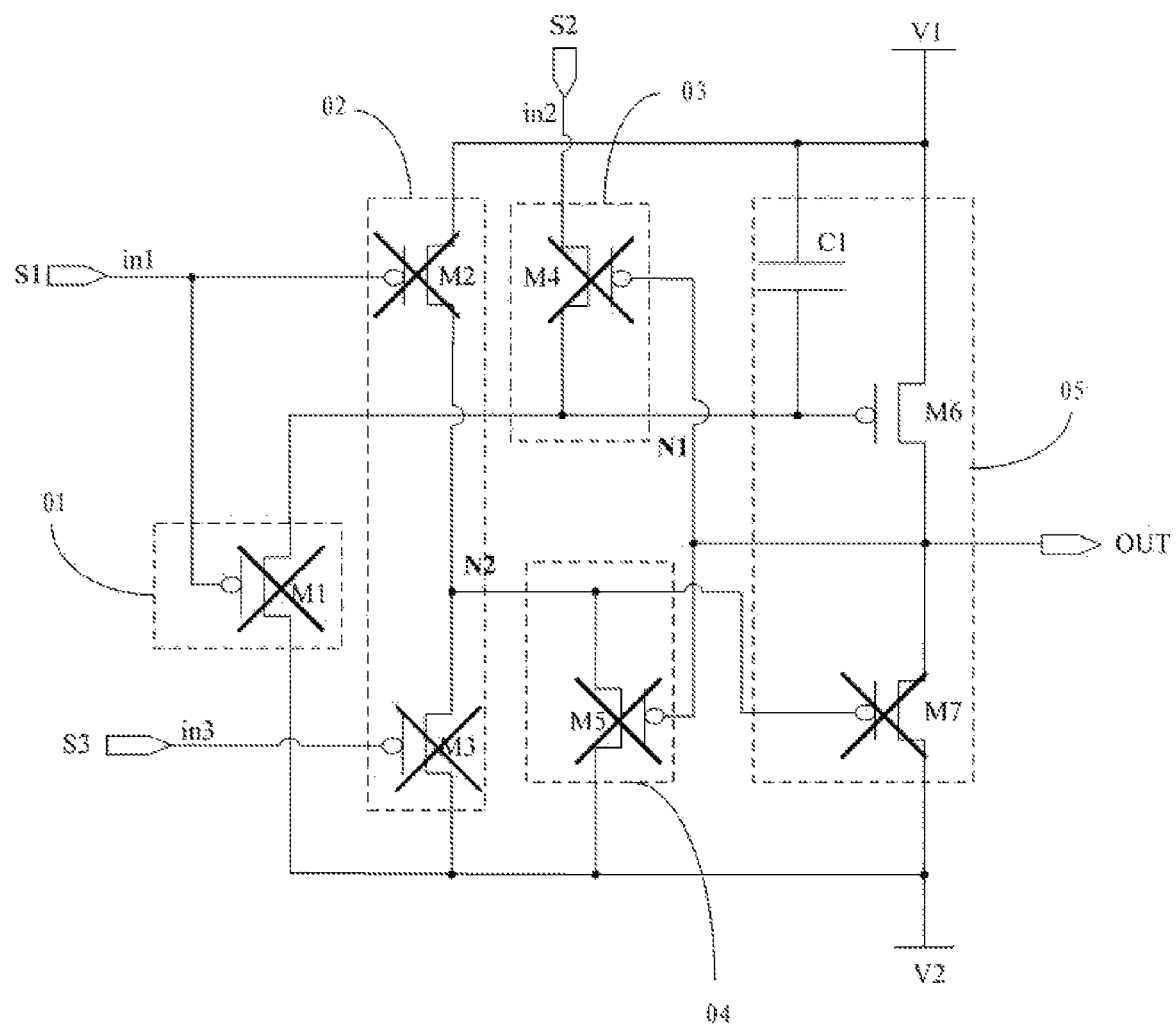
FIG. 8B shows a schematic diagram of operating states of the respective transistors in the shift register element in a T2 stage as illustrated in FIG. 7 according to the embodiment of the invention.

As illustrated in FIG. 8B which shows a schematic diagram of operating states of the respective transistors in the shift register element according to the embodiment of the invention in the T2 stage, with S1=1, the first transistor M1 and the second transistor M2 are switched off. With S3=1, the third transistor M3 is switched off. The first node N1 is floating, the potential of the first node N1 is maintained at the low-level as in the T1 stage due to the first capacitor C1, and the sixth transistor M6 is switched on. The high-level signal of the first signal terminal V1 is transmitted to the output terminal OUT through the sixth transistor M6, so the potential of the output terminal OUT is at high-level. Also the fourth transistor M4 and the fifth transistor M5 are further controlled by the output terminal OUT to be switched off. The potential of the second node N2 is still maintained at high-level, and the seventh transistor M7 is switched off.

In the T3 stage, S1=1, S2=1, and S3=0.

Figure 8C:
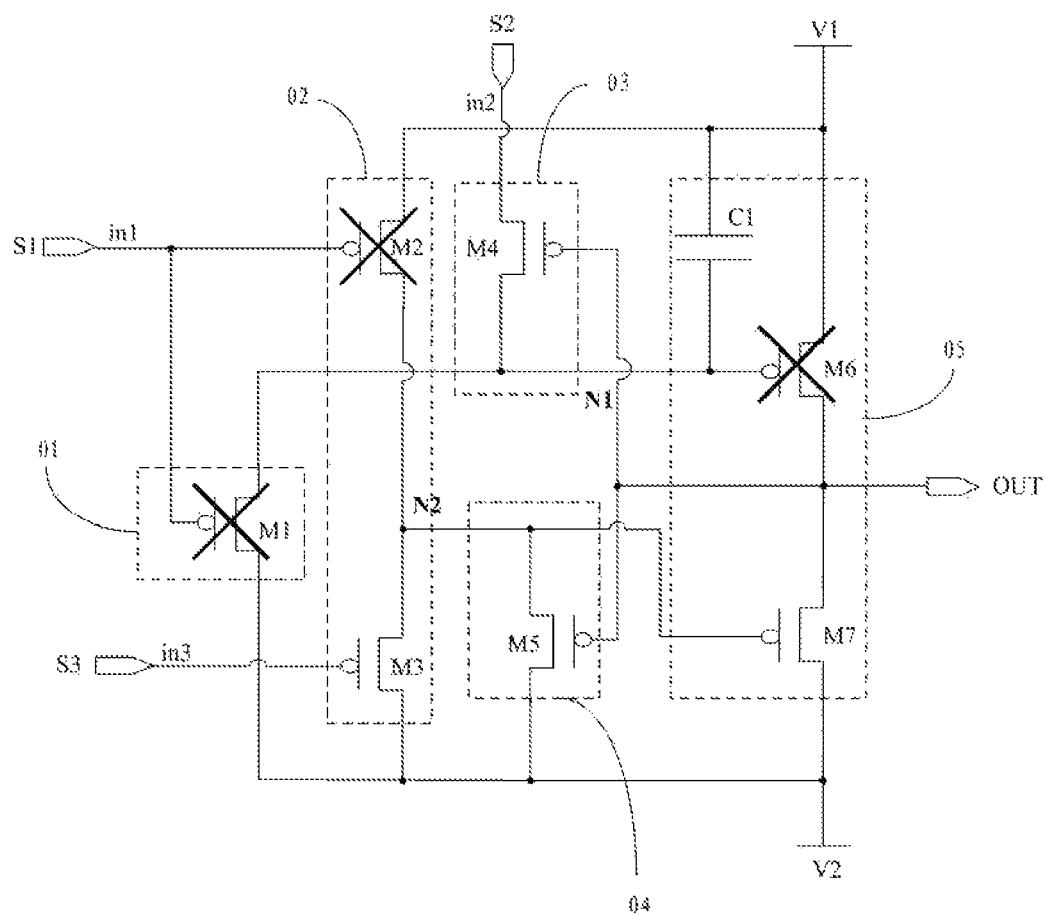
FIG. 8C shows a schematic diagram of operating states of the respective transistors in the shift register element in a T3 stage as illustrated in FIG. 7 according to the embodiment of the invention.

As illustrated in FIG. 8C which shows a schematic diagram of operating states of the respective transistors in the shift register element according to the embodiment of the invention in the T3 stage, with S1=1, the first transistor M1 and the second transistor m2 are switched off. With S3=0, the third transistor M3 is switched on. The low-level signal of the second signal terminal V2 is transmitted to the second node N2 through the third transistor M3, so the second node N2 is at a low potential, and the seventh transistor M7 is switched on. The low-level signal of the second signal terminal V2 is transmitted to the output terminal OUT through the seventh transistor M7, so the potential of the output terminal OUT is at low-level. Also the fourth transistor M4 and the fifth transistor M5 are further controlled by the output terminal OUT to be switched on. The low-level signal of the second signal terminal V2 is transmitted to the second node N2 through the fifth transistor M5 to thereby further enable the potential of the second node N2 to be at low-level. The second scan signal S2 at a high level is transmitted to the first node N1 through the fourth transistor M4 to thereby enable the potential of the first node N1 to be at high-level so as to avoid the sixth transistor M6 from being switched on.

In this T3 stage, if the third transistor M3 is switched on, then the potential of the second node N2 will be changed to a low-level, and because of the parasitic capacitances of the third transistor M3, the fifth transistor M5, and the seventh transistor M7, if the fifth transistor M5 is controlled by the output terminal OUT to be switched on, then the potential of the second node N2 will be further pulled down, so the seventh transistor M7 is switched on completely, and there is no step in the signal output at the output terminal OUT. In the traditional shift register element controlled using a clock signal, since there is threshold voltage of a transistor, the transistor at the output terminal cannot be switched on completely upon being controlled to be switched on, thus resulting in a step in the output.

In the T4 stage, S1=1, S2=1, and S3=1.

Figure 8D:
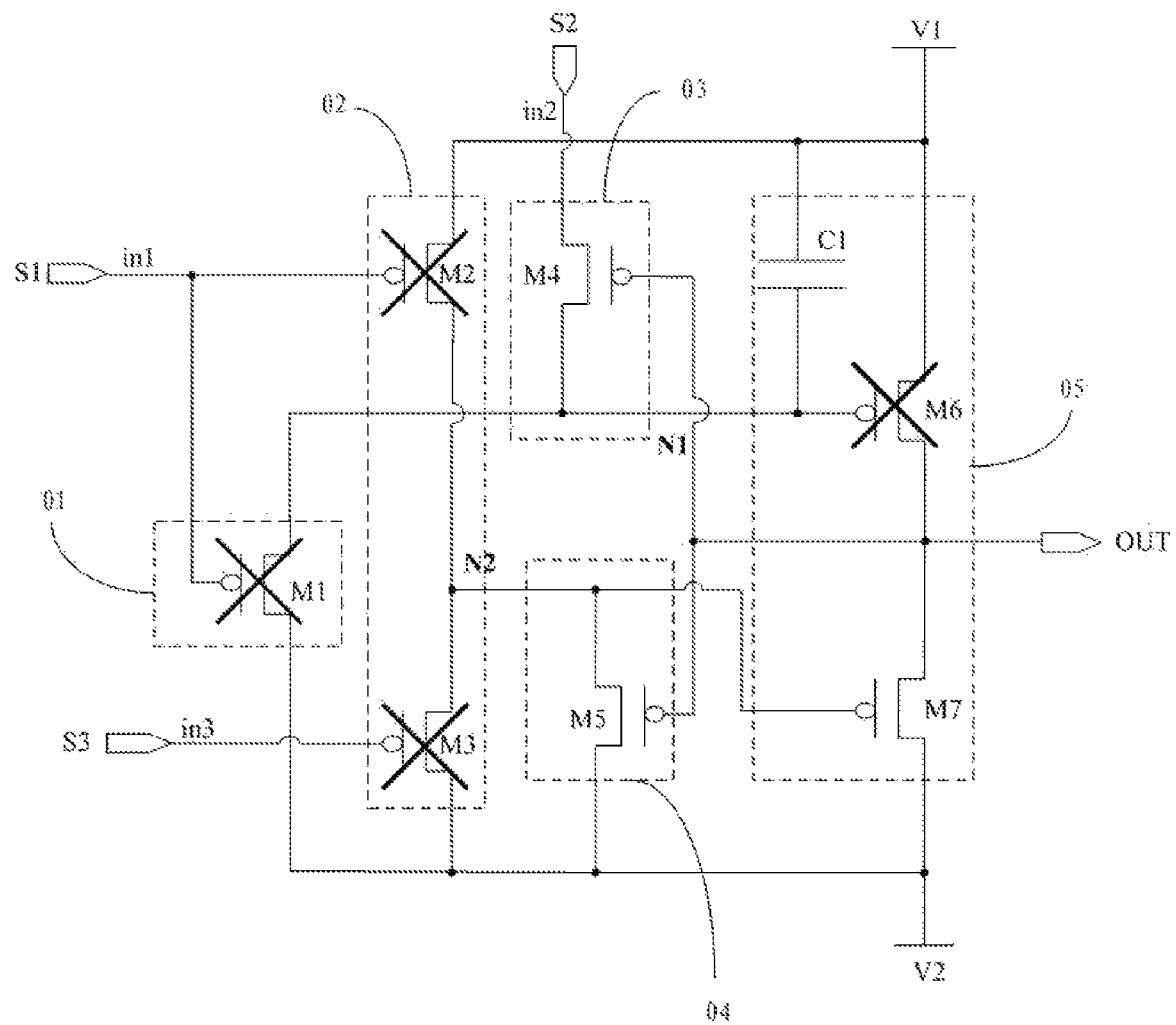
FIG. 8D shows a schematic diagram of operating states of the respective transistors in the shift register element in a T4 stage as illustrated in FIG. 7 according to the embodiment of the invention.

As illustrated in FIG. 8D which shows a schematic diagram of operating states of the respective transistors in the shift register element according to the embodiment of the invention in the T4 stage, with S1=1, the first transistor M1 and the second transistor M2 are switched off. With S3=1, the third transistor M3 is switched off. The potential of the first node N1 is maintained at the high-level as in the T3 stage due to the first capacitor C1, and the sixth transistor M6 is switched off. The second node N2 is still maintained at a low potential, and the seventh transistor M7 is switched on. The low-level signal of the second signal terminal V2 is transmitted to the output terminal OUT through the seventh transistor M7, so the potential of the output terminal OUT is at low-level. Also the fourth transistor M4 and the fifth transistor M5 are further controlled by the output terminal OUT to be switched on. The low-level signal of the second signal terminal V2 is transmitted to the second node N2 through the fifth transistor M5 to further enable the potential of the second node N2 to be at low-level. The second scan signal S2 at a high potential is transmitted to the first node N1 through the fourth transistor M4 to enable the potential of the first node N1 to be at high-level so as to avoid the sixth transistor M6 from being switched on.

In this T4 stage, the fifth transistor M5 provides the second node N2 with a low potential all the time, and the fourth transistor M4 provides the first node N1 with a high potential all the time, thus avoiding the first node and the second node from floating so that there are setting signals at the first node and the second node all the time to thereby avoid the output of the circuit from any interference of an external signal, thus improving the reliability of the circuit.

In the first example, the fourth transistor M4 is switched on only in the T3 and T4 stages, and if the fourth transistor M4 is switched on, then the first node N1 will be provided with a high-level signal, so if all the transistors in the shift register element according to the embodiment of the invention are P-type transistors, then it would suffice that the signal input at the second input terminal is a high-level signal in the T3 and T4 stages.

It shall be noted that "x" represents a transistor being switched off in FIG. 8A to FIG. 8D.

Second Example

Figure 9:
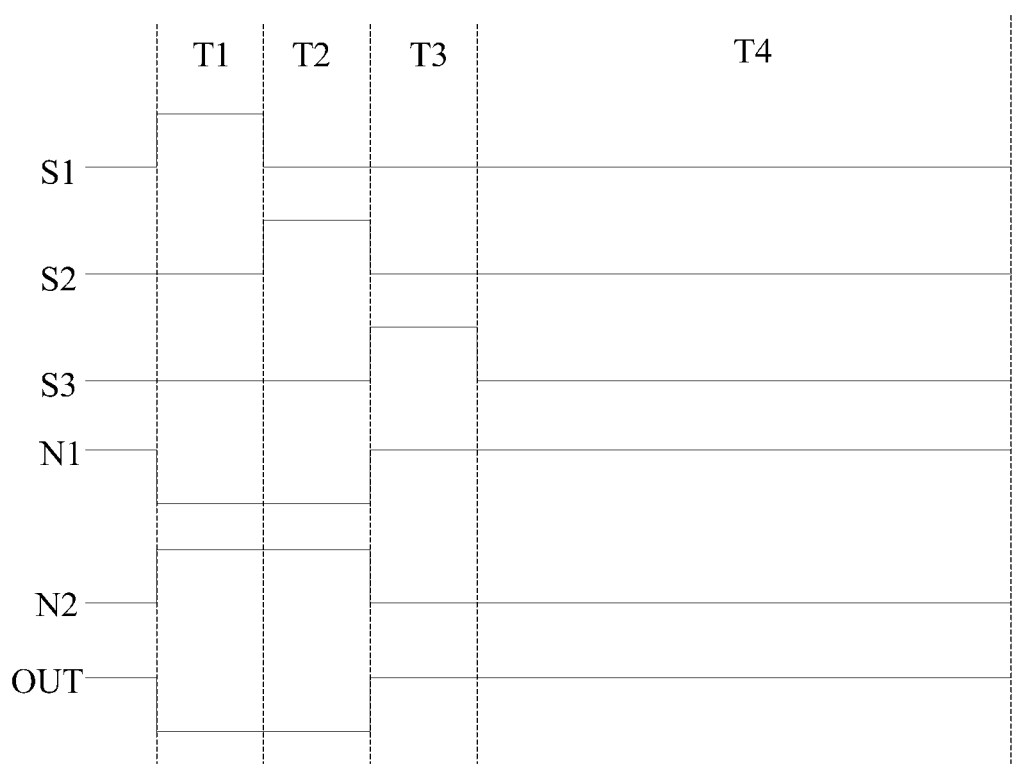
FIG. 9 is an input-output timing diagram corresponding to the shift register element according to another embodiment of the invention.

Taking the shift register element illustrated in FIG. 5 as an example, all the transistors in the shift register element are N-type transistors, and a corresponding input-output timing diagram is as illustrated in FIG. 9; and particularly, there are four stages T1, T2, T3, and T4 in the input-output timing diagram as illustrated in FIG. 9.

In the T1 stage, S1=1, and S3=0.

With S1=1, the first transistor M1 and the second transistor M2 are switched on. With S3=0, the third transistor M3 is switched off. The low-level signal of the first signal terminal V1 is transmitted to the second node N2 through the second transistor M2, so the potential of the second node N2 is at low-level, and the seventh transistor M7 is switched off. The high-level signal of the second signal terminal V2 is transmitted to the first node N1 through the first transistor M1, so the first node N1 is at a high potential, and the sixth transistor M6 is switched on. The low-level signal of the first signal terminal V1 is transmitted to the output terminal OUT through the sixth transistor M6, so the potential of the output terminal OUT is at low-level. Also the fourth transistor M4 and the fifth transistor M5 are further controlled by the output terminal OUT to be switched off.

In the T2 stage, S1=0, and S3=0.

With S1=0, the first transistor M1 and the second transistor M2 are switched off. With S3=0, the third transistor M3 is switched off. The first node N1 is floating, the potential of the first node N1 is maintained at the high-level as in the T1 stage due to the first capacitor C1, and the sixth transistor M6 is switched on. The low-level signal of the first signal terminal V1 is transmitted to the output terminal OUT through the sixth transistor M6, so the potential of the output terminal OUT is at low-level. Also the fourth transistor M4 and the fifth transistor M5 are further controlled by the output terminal OUT to be switched off. The potential of the second node N2 is still maintained at low-level, and the seventh transistor M7 is switched off.

In the T3 stage, S1=0, and S3=1.

With S1=0, the first transistor M1 and the second transistor M2 are switched off. With S3=1, the third transistor M3 is switched on. The high-level signal of the second signal terminal V2 is transmitted to the second node N2 through the third transistor M3, so the second node N2 is at a high potential, and the seventh transistor M7 is switched on. The high-level signal of the second signal terminal V2 is transmitted to the output terminal OUT through the seventh transistor M7, so the potential of the output terminal OUT is at high-level. Also the fourth transistor M4 and the fifth transistor M5 are further controlled by the output terminal OUT to be switched on. The high-level signal of the second signal terminal V2 is transmitted to the second node N2 through the fifth transistor M5 to thereby further enable the potential of the second node N2 to be at high-level. The low-level signal of the first signal terminal V1 is transmitted to the first node N1 through the fourth transistor M4 to thereby enable the potential of the first node N1 to be at low-level so as to avoid the sixth transistor M6 from being switched on.

In this T3 stage, if the third transistor M3 is switched on, then the potential of the second node N2 will be changed to a high-level, and because of the parasitic capacitances of the third transistor M3, the fifth transistor M5, and the seventh transistor M7, if the fifth transistor M5 is controlled by the output terminal OUT to be switched on, then the potential of the second node N2 will be further pulled up, so the seventh transistor M7 is switched on completely, and there is no step in the signal output at the output terminal OUT.

In the T4 stage, S1=0, S2=0, and S3=0.

With S1=0, the first transistor M1 and the second transistor M2 are switched off. With S3=0, the third transistor M3 is switched off. The potential of the first node N1 is maintained at the low-level as in the T3 stage due to the first capacitor C1, and the sixth transistor M6 is switched off. The second node N2 is still maintained at a high-level, and the seventh transistor M7 is switched on. The high-level signal of the second signal terminal V2 is transmitted to the output terminal OUT through the seventh transistor M7, so the potential of the output terminal OUT is at high-level. Also the fourth transistor M4 and the fifth transistor M5 are further controlled by the output terminal OUT to be switched on. The high-level signal of the second signal terminal V2 is transmitted to the second node N2 through the fifth transistor M5 to further enable the potential of the second node N2 to be at the high-level. The signal of the first signal terminal V1 input to the second input terminal at a low potential is transmitted to the first node N1 through the fourth transistor M4 to enable the potential of the first node N1 to be at the low-level so as to avoid the sixth transistor M6 from being switched on.

In this T4 stage, the fifth transistor M5 provides the second node N2 with a high potential all the time, and the fourth transistor M4 provides the first node N1 with a low potential all the time, thus avoiding the first node and the second node from floating so that there are setting signals at the first node and the second node all the time to thereby avoid the output of the circuit from any interference of an external signal, thus improving the reliability of the circuit.

In the second example, the fourth transistor M4 is switched on only in the T3 and T4 stages, and if the fourth transistor M4 is switched on, then the first node N1 will be provided with a low-level signal, so if all the transistors in the shift register element according to the embodiment of the invention are N-type transistors, then it will suffice if the signal input at the second input terminal is a low-level signal in the T3 and T4 stages.

In one or more embodiment, in the shift register element according to the embodiment of the invention, since the sixth transistor and the seventh transistor are configured for output, there are larger channel width-to-length-ratios of the sixth transistor and the seventh transistor than those of the other transistors. Furthermore in the shift register element according to the embodiment of the invention, since the first capacitor is configured to control the potential of the first node, the capacitance of the first capacitor is typically above 100 fF in an implementation.

Figure 10:
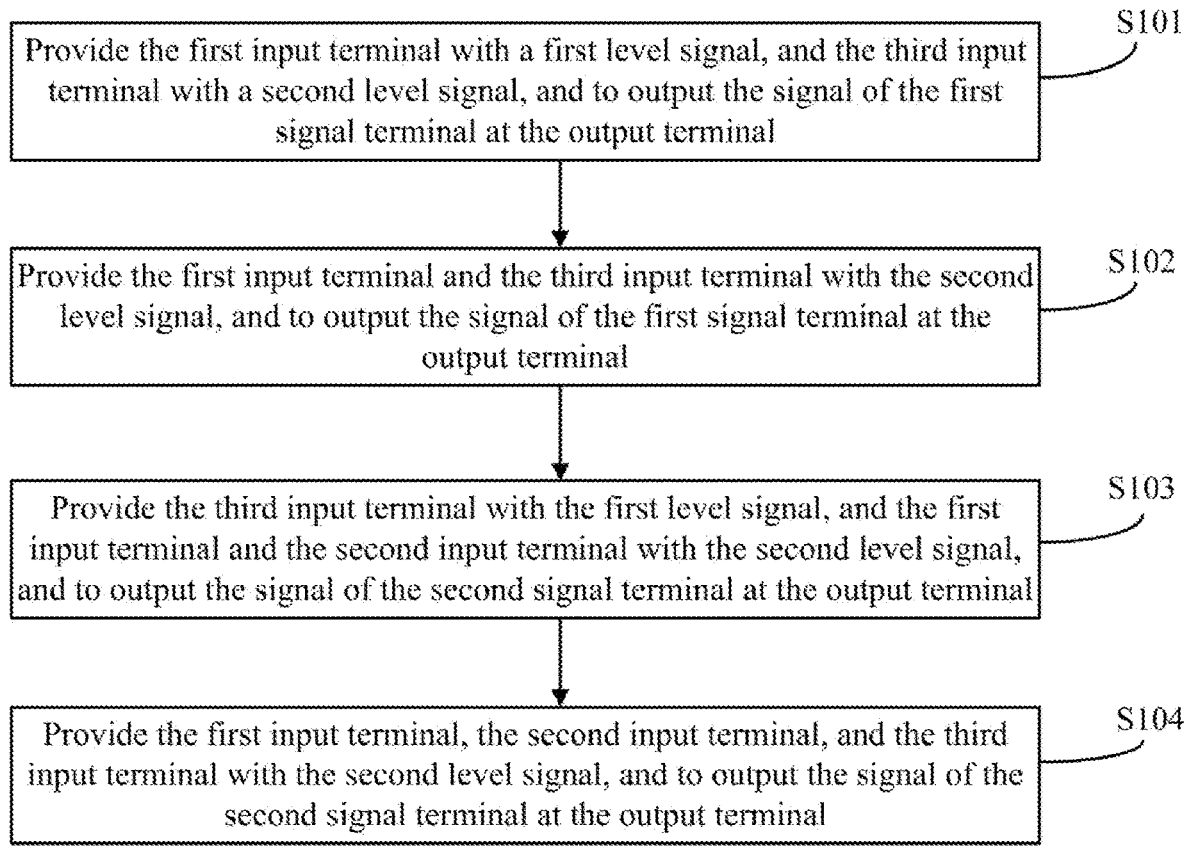
FIG. 10 is a flow chart of a method for driving a shift register element according to an embodiment of the invention.

Based upon the same inventive idea, an embodiment of the invention further provides a method for driving the shift register element above as illustrated in FIG. 10, where the method includes the following steps:

S101: in a first stage, providing the first input terminal with a first level signal, and the third input terminal with a second level signal, to output the signal of the first signal terminal at the output terminal;

S102: in a second stage, providing the first input terminal and the third input terminal with the second level signal, to output the signal of the first signal terminal at the output terminal;

S103: in a third stage, providing the third input terminal with the first level signal, and the first input terminal and the second input terminal with the second level signal, to output the signal of the second signal terminal at the output terminal; and S104: in a fourth stage, providing the first input terminal, the second input terminal, and the third input terminal with the second level signal, to output the signal of the second signal terminal at the output terminal.

In one or more embodiment, in the driving method according to the embodiment of the invention as illustrated in FIG. 10, if the first level signal is a high-level signal, and the second level signal is a low-level signal, then reference can be made to the T1 to T4 stages in the first example above for particular operating principles in the respective stages, so a repeated description thereof will be omitted here.

In one or more embodiment, in the driving method according to the embodiment of the invention as illustrated in FIG. 10, if the first level signal is a low-level signal, and the second level signal is a high-level signal, then reference can be made to the T1 to T4 stages in the second example above for particular operating principles in the respective stages, so a repeated description thereof will be omitted here.

Optionally, the driving method according to the embodiment of the invention further includes: in the first stage, providing the second input terminal with the second level signal; and in the second stage, providing the second input terminal with the first level signal. A schematic timing diagram thereof is illustrated in FIG. 11A which shows a timing diagram corresponding to the driving method according to the embodiment of the invention.

Optionally, the driving method according to the embodiment of the invention further includes: in the first stage, providing the second input terminal with the first level signal; and in the second stage, providing the second input terminal with the second level signal. A schematic timing diagram thereof is illustrated in FIG. 11B which shows another timing diagram corresponding to the driving method according to the embodiment of the invention.

Optionally, the driving method according to the embodiment of the invention further includes: in the first stage, providing the second input terminal with the second level signal; and in the second stage, providing the second input terminal with the second level signal. A schematic timing diagram thereof is illustrated in FIG. 11C which shows another timing diagram corresponding to the driving method according to the embodiment of the invention.

Figure 11A:
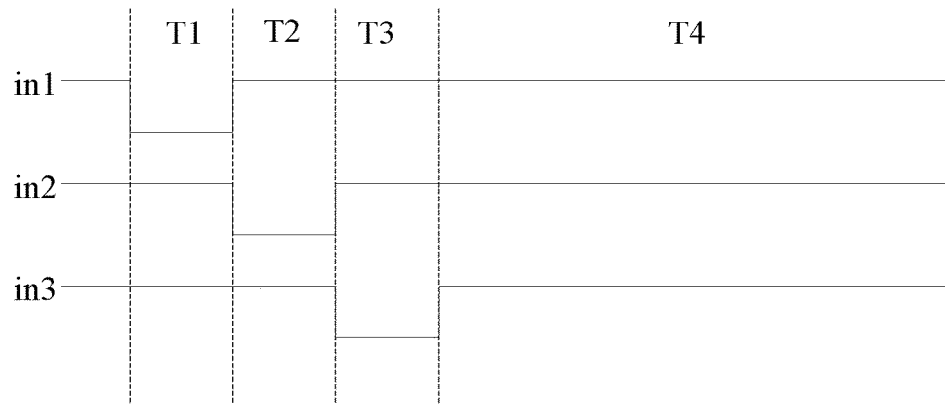
FIG. 11A is a timing diagram corresponding to the driving method according to an embodiment of the invention.
Figure 11B:
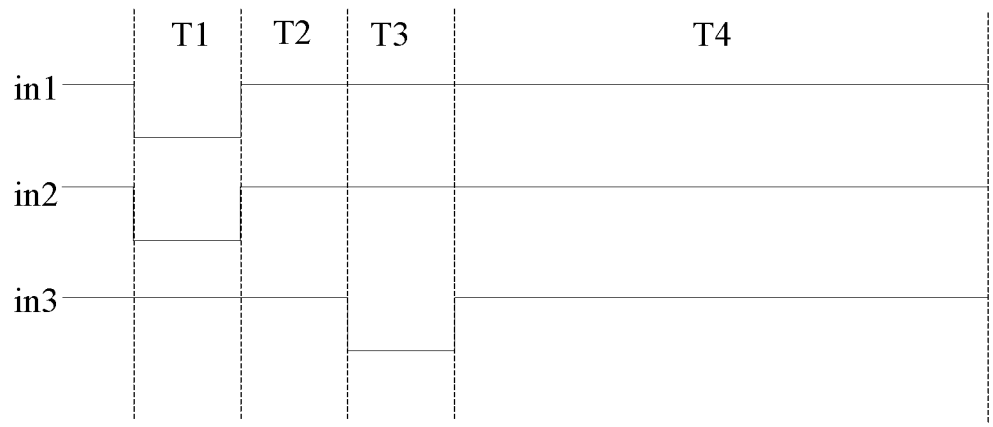
FIG. 11B is a timing diagram corresponding to the driving method according to another embodiment of the invention.
Figure 11C:
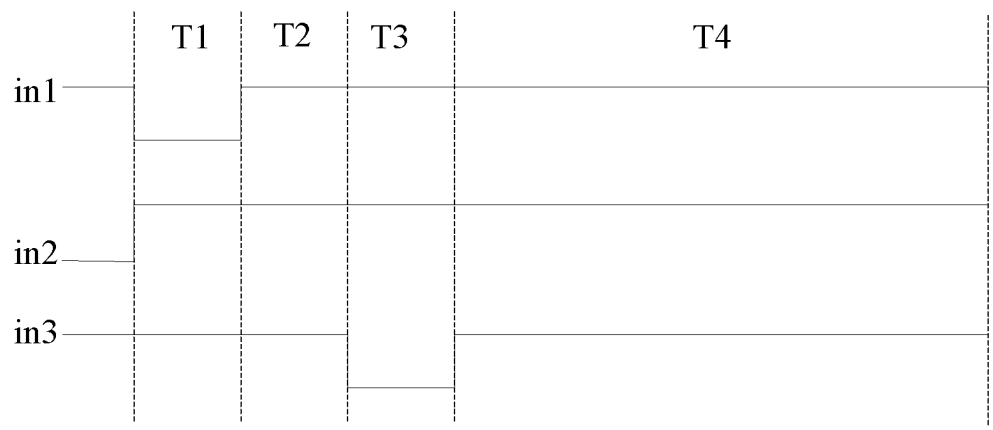
FIG. 11C is a timing diagram corresponding to the driving method according to another embodiment of the invention.

It shall be noted that in FIG. 11A to FIG. 11C, the first level signal is a low-level signal, and the second level signal is a high-level signal, by way of an example.

Figure 12A:
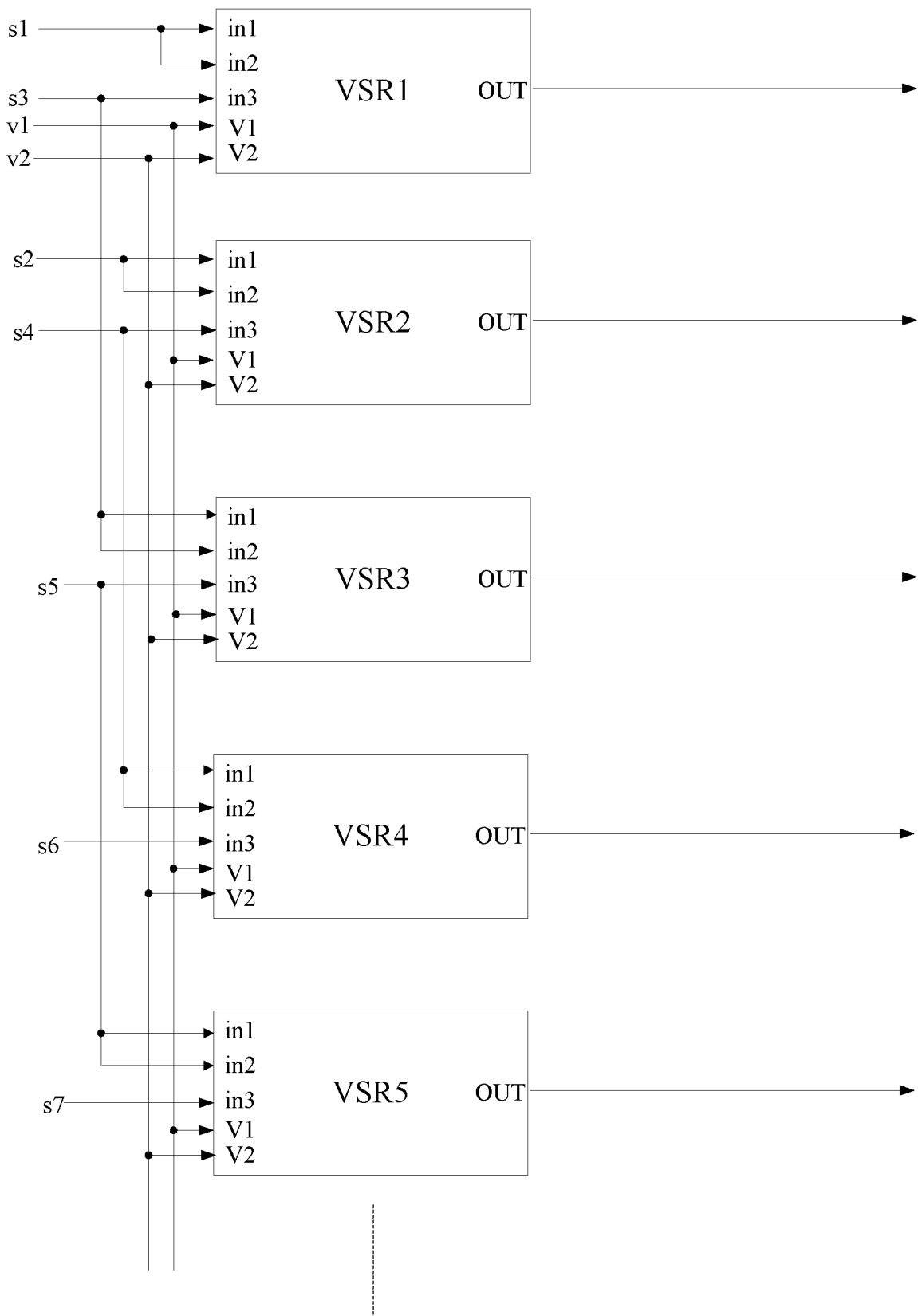
FIG. 12A is a schematic structural diagram of a display panel according to an embodiment of the invention.
Figure 12B:
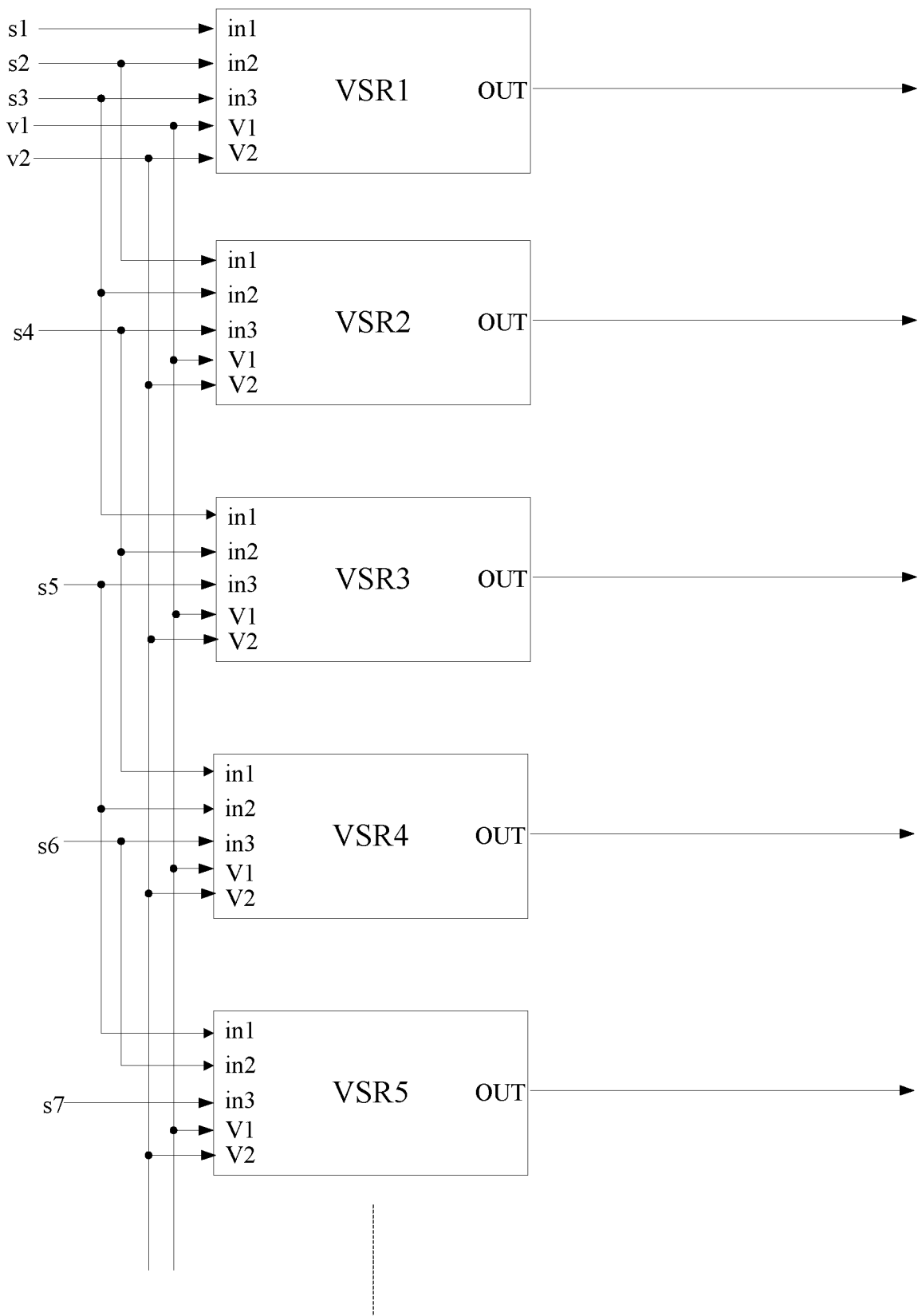
FIG. 12B is a schematic structural diagram of the display panel according to another embodiment of the invention.
Figure 12C:
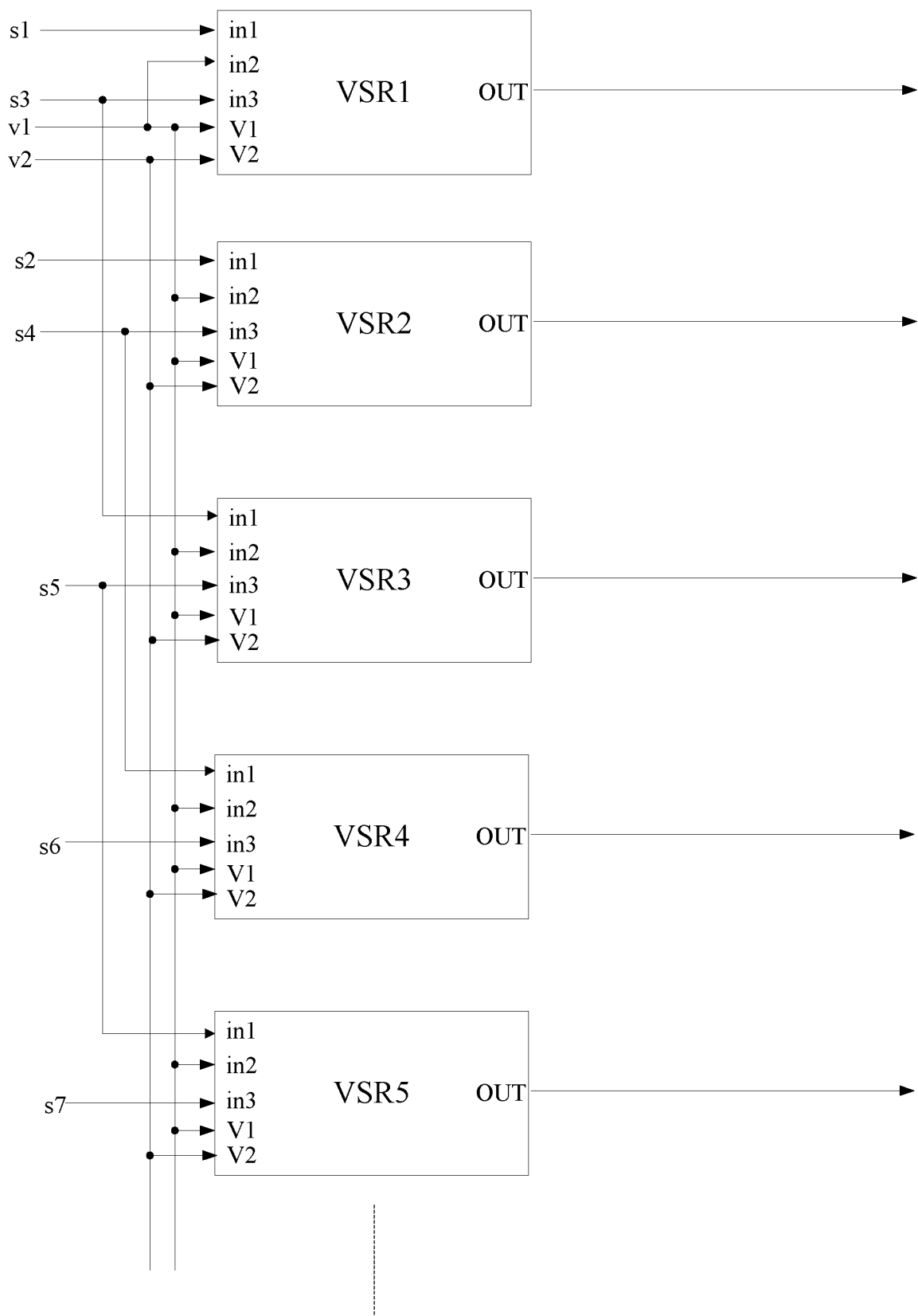
FIG. 12C is a schematic structural diagram of the display panel according to another embodiment of the invention.

Based upon the same inventive idea, an embodiment of the invention further provides a display panel as illustrated in FIG. 12A to FIG. 12C, where FIG. 12A shows a schematic structural diagram of a display panel according to an embodiment of the invention; FIG. 12B shows another schematic structural diagram of the display panel according to the embodiment of the invention; and FIG. 12C shows a further schematic structural diagram of the display panel according to the embodiment of the invention. Where the display panel includes N shift register elements VSR1 to VSRN in cascade connection according to any one of the embodiments above of the invention, where N is an integer. FIG. 12A to FIG. 12C illustrate the display panel with N=5 by way of an example.

The display panel according to the embodiment of the invention includes the shift register element, which includes: the output module configured to provide the output terminal with the signal of the first signal terminal or the second signal terminal according to the voltage applied to the first node and the second node; the first driver configured to control the voltage of the first node according to the signal of the first input terminal; the second driver configured to control the voltage of the second node according to the signals of the first input terminal and the third input terminal; the first feedback and adjustment module configured to control the voltage of the first node according to the signals of the output terminal and the second input terminal; and the second feedback and adjustment module configured to control the voltage of the second node according to the signal of the output terminal. Since the first feedback and adjustment module control the first node using the output terminal, and the second feedback and adjustment module control the second node using the output terminal, the first node and the second node can be set and reset in real time to thereby avoid the output of the circuit from any external interference so as to improve the reliability of the circuit.

In one or more embodiment, the display panel according to the embodiment of the invention further includes a first power source line v1 and a second power source line v2 as illustrated in FIG. 12A to FIG. 12C.

The first signal terminals V1 of all the shift register elements (VSR1 to VSRN) are connected with the first power source line v1.

The second signal terminals V2 of all the shift register elements (VSR1 to VSRN) are connected with the second power source line v2.

In one or more embodiment, the display panel according to the embodiment of the invention further includes N+2 scan lines (s1 to sN+2) as illustrated in FIG. 12A to FIG. 12C.

The first input terminal in1 of the n-th shift register element VSRn is connected with the n-th scan signal line, where n is any integer from 1 to N.

The third input terminal in3 of the n-th shift register element VSRn is connected with the (n+2)-th scan signal line.

As illustrated in FIG. 12A, the second input terminal in2 of the n-th shift register element is connected with the n-th scan signal line.

Alternatively, as illustrated in FIG. 12B, the second input terminal in2 of the n-th shift register element is connected with the (n+1)-th scan signal line sN+1.

Alternatively, as illustrated in FIG. 12C, the second input terminals in2 of all the shift register elements (VSR1 to VSRN) are connected with the first power source line v1.

Figure 13:
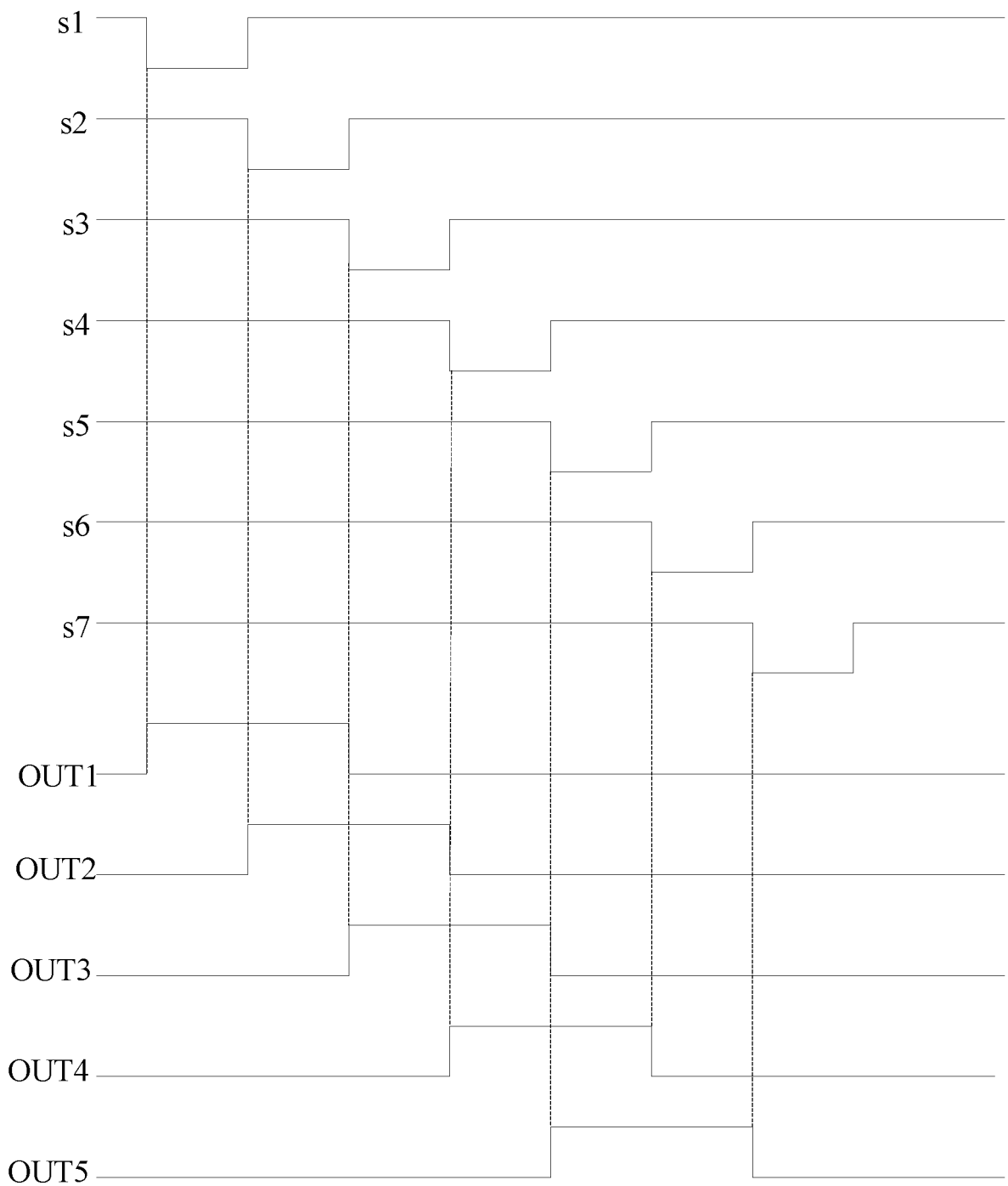
FIG. 13 is an input-output timing diagram of the display panel according to an embodiment of the invention.

In one or more embodiment, in the display panel as illustrated in FIG. 12A to FIG. 12C, a timing diagram corresponding to the signals OUT1 to OUT5 output by the first to fifth shift register elements is illustrated in FIG. 13 which is an input-output timing diagram of a display panel according to an embodiment of the invention; and FIG. 13 illustrates the first level signal as a low-level signal, and the second level signal as a high-level signal, by way of an example.

Figure 14:
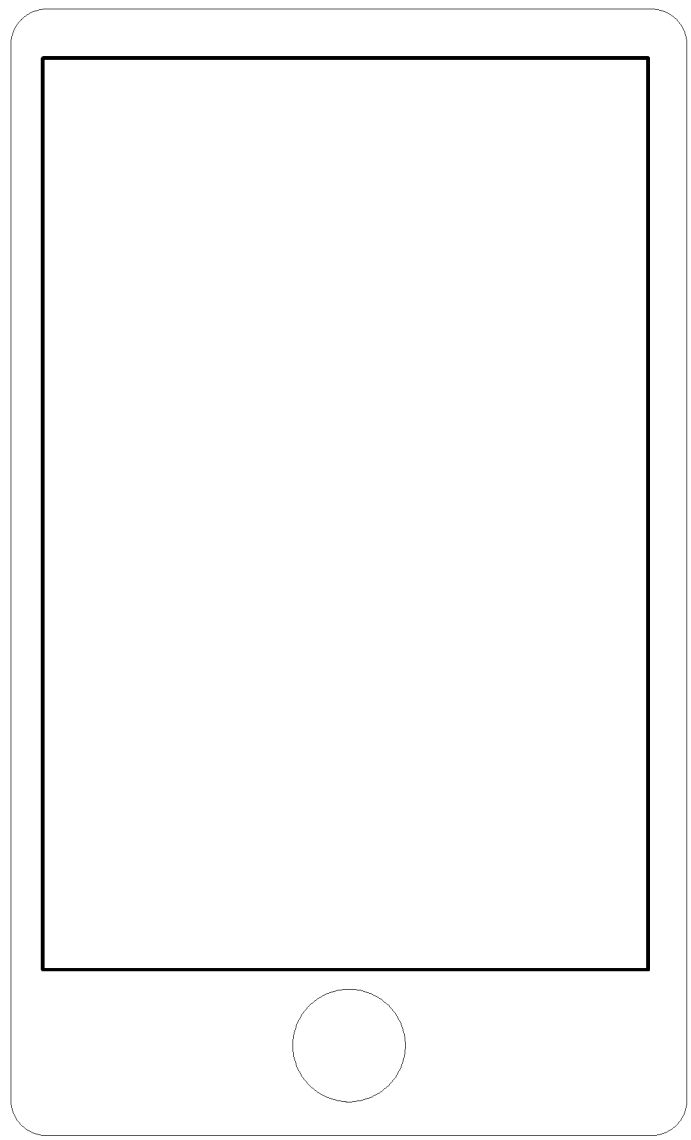
FIG. 14 is a schematic structural diagram of a display device according to an embodiment of the invention.

Based upon the same inventive idea, an embodiment of the invention further provides a display device as illustrated in FIG. 14, which is a schematic structural diagram of a display device according to an embodiment of the invention, where the display device includes the display panel according to any one of the embodiments above of the invention. The display panel can be a mobile phone, a tablet computer, a TV set, a display, a notebook computer, a digital photo frame, a navigator, or any other product or component capable of displaying. Reference can be made to the embodiment above of the display panel for an implementation of the display device, so a repeated description thereof will be omitted here.

In the shift register element, the method for driving the same, the display panel, and the display device according to the embodiments of the invention, the shift register element includes: the output module configured to provide the output terminal with the signal of the first signal terminal or the second signal terminal according to the voltage applied to the first node and the second node; the first driver configured to control the voltage of the first node according to the signal of the first input terminal; the second driver configured to control the voltage of the second node according to the signals of the first input terminal and the third input terminal; the first feedback and adjustment module configured to control the voltage of the first node according to the signals of the output terminal and the second input terminal; and the second feedback and adjustment module configured to control the voltage of the second node according to the signal of the output terminal. Since the first feedback and adjustment module control the first node using the output terminal, and the second feedback and adjustment module control the second node using the output terminal, the first node and the second node can be set and reset in real time to thereby avoid the output of the circuit from any external interference so as to improve the reliability of the circuit.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A shift register element, comprising:
an output module having a first node and a second node, wherein the output module is configured to provide an output terminal with a signal of a first signal terminal or a second signal terminal according to voltage applied to the first node and the second node;
a first driver configured to control the voltage of the first node according to a signal of a first input terminal;
a second driver configured to control the voltage of the second node according to the signal of the first input terminal, and a signal of a third input terminal;
a first feedback and adjustment module configured to control the voltage of the first node according to a signal of the output terminal and a signal of a second input terminal; and
a second feedback and adjustment module configured to control the voltage of the second node according to the signal of the output terminal.

2. The shift register element according to claim 1, wherein:
the first input terminal is configured to receive a first scan signal;
the second input terminal is configured to receive a second scan signal, the first scan signal, or the signal of the first signal terminal; and
the third input terminal is configured to receive a third scan signal.

3. The shift register element according to claim 2, wherein:
active pulse signals of the first scan signal, the second scan signal, and the third scan signal are maintained for a same length of time, the active pulse signal of the second scan signal is output after output of the active pulse signal of the first scan signal ends, and the active pulse signal of the third scan signal is output after output of the active pulse signal of the second scan signal ends.

4. The shift register element according to claim 2, wherein:
the signal of the first signal terminal is a high-level signal, and the signal of the second signal terminal is a low-level signal; and
the active pulse signals of the first scan signal, the second scan signal, and the third scan signal are low-level signals.

5. The shift register element according to claim 2, wherein:
the signal of the first signal terminal is a low-level signal, and the signal of the second signal terminal is a high-level signal; and
the active pulse signals of the first scan signal, the second scan signal, and the third scan signal are high-level signals.

6. The shift register element according to claim 1, wherein:
the first driver comprises a first transistor, wherein
the first transistor has a gate connected with the first input terminal, a first electrode connected with the second signal terminal, and a second electrode connected with the first node.

7. The shift register element according to claim 1, wherein:
the second driver comprises a second transistor and a third transistor, wherein:
the second transistor has a gate connected with the first input terminal, a first electrode connected with the first signal terminal, and a second electrode connected with the second node; and
the third transistor has a gate connected with the third input terminal, a first electrode connected with the second signal terminal, and a second electrode connected with the second node.

8. The shift register element according to claim 1, wherein:
the first feedback and adjustment module comprises a fourth transistor, wherein
the fourth transistor has a gate connected with the output terminal, a first electrode connected with the second input terminal, and a second electrode connected with the first node.

9. The shift register element according to claim 1, wherein:
the second feedback and adjustment module comprises a fifth transistor, wherein
the fifth transistor has a gate connected with the output terminal, a first electrode connected with the second signal terminal, and a second electrode connected with the second node.

10. The shift register element according to claim 1, wherein:
the output module comprises a sixth transistor, a seventh transistor, and a first capacitor, wherein:
the sixth transistor has a gate connected with the first node, a first electrode connected with the first signal terminal, and a second electrode connected with the output terminal;
the seventh transistor has a gate connected with the second node, a first electrode connected with the second signal terminal, and a second electrode connected with the output terminal; and
the first capacitor has one terminal connected with the first node, and other terminal connected with the first signal terminal.

11. A method for driving the shift register element according to claim 1, the method comprising:
in a first stage, providing the first input terminal with a first level signal, providing the third input terminal with a second level signal, and outputting the signal of the first signal terminal at the output terminal;
in a second stage, providing the first input terminal and the third input terminal with the second level signal, and outputting the signal of the first signal terminal at the output terminal;
in a third stage, providing the third input terminal with the first level signal, providing the first input terminal and the second input terminal with the second level signal, and outputting the signal of the second signal terminal at the output terminal; and
in a fourth stage, providing the first input terminal, the second input terminal, providing the third input terminal with the second level signal, and outputting the signal of the second signal terminal at the output terminal.

12. The driving method according to claim 11, wherein the method further comprises:
in the first stage, providing the second input terminal with the first level signal; and
in the second stage, providing the second input terminal with the second level signal.

13. The driving method according to claim 11, wherein the method further comprises:
in the first stage, providing the second input terminal with the second level signal; and
in the second stage, providing the second input terminal with the first level signal.

14. The driving method according to claim 11, wherein the method further comprises:
in the first stage, providing the second input terminal with the second level signal; and
in the second stage, providing the second input terminal with the second level signal.

15. A display device, comprising a display panel which comprises N shift register elements in cascade connection, wherein N is an integer, wherein each of the N shift register element comprises:
an output module having a first node and a second node, wherein the output module is configured to provide an output terminal with a signal of a first signal terminal or a second signal terminal according to voltage applied to the first node and the second node;
a first driver configured to control the voltage of the first node according to a signal of a first input terminal;
a second driver configured to control the voltage of the second node according to the signal of the first input terminal, and a signal of a third input terminal;
a first feedback and adjustment module configured to control the voltage of the first node according to a signal of the output terminal and a signal of a second input terminal; and
a second feedback and adjustment module configured to control the voltage of the second node according to the signal of the output terminal.

16. The display device according to claim 15, wherein:
the display panel further comprises a first power source line and a second power source line;
the first signal terminals of the N shift register elements are connected with the first power source line; and
the second signal terminals of the N shift register elements are connected with the second power source line.

17. The display device according to claim 16, wherein:
the display panel further comprises N+2 scan lines;
a first input terminal of n-th shift register element is connected with n-th scan signal line, wherein n is any integer from 1 to N;
a third input terminal of the n-th shift register element is connected with the (n+2)-th scan signal line; and
a second input terminal of the n-th shift register element is connected with the n-th scan signal line; or the second input terminal of the n-th shift register element is connected with the (n+1)-th scan signal line; or the second input terminals of all the shift register elements are connected with the first power source line.

* * * * *